United States Patent
Park et al.

(10) Patent No.: US 8,294,021 B2
(45) Date of Patent: Oct. 23, 2012

(54) PHOTOVOLTAIC DEVICE AND METHOD FOR MANUFACTURING THE SAME

(75) Inventors: Min Park, Seoul (KR); Min-Seok Oh, Yongin-si (KR); Jung-Tae Kim, Cheonan-si (KR); Czang-Ho Lee, Suwon-si (KR); Myung-Hun Shin, Suwon-si (KR); Byoung-Kyu Lee, Suwon-si (KR); Ku-Hyun Kang, Suwon-si (KR); Yuk-Hyun Nam, Goyang-si (KR); Seung-Jae Jung, Seoul (KR); Mi-Hwa Lim, Chungcheongnam-do (KR); Joon-Young Seo, Seoul (KR)

(73) Assignees: Samsung Electronics Co., Ltd., Suwon-si, Gyeonggi-do (KR); Samsung SDI Co., Ltd., Yongin-si, Gyeonggi-do (KR)

( * ) Notice: Subject to any disclaimer, the term of this patent is extended or adjusted under 35 U.S.C. 154(b) by 619 days.

(21) Appl. No.: 12/486,654

(22) Filed: Jun. 17, 2009

(65) Prior Publication Data
US 2010/0101633 A1   Apr. 29, 2010

(30) Foreign Application Priority Data

Oct. 23, 2008 (KR) .................. 10-2008-0104295
Nov. 7, 2008 (KR) .................. 10-2008-0110615

(51) Int. Cl.
*H02N 6/00* (2006.01)
*H01L 31/042* (2006.01)
*H01L 21/00* (2006.01)

(52) U.S. Cl. .................... 136/244; 438/73
(58) Field of Classification Search .......... 136/244, 136/245, 249, 255, 256, 258; 438/73
See application file for complete search history.

(56) References Cited

U.S. PATENT DOCUMENTS

| | | | |
|---|---|---|---|
| 4,605,813 A | 8/1986 | Takeuchi et al. | |
| 4,948,436 A | 8/1990 | Juergens | |
| 5,527,716 A | 6/1996 | Kusian et al. | |
| 5,797,998 A | 8/1998 | Wenham et al. | |
| 6,187,150 B1 * | 2/2001 | Yoshimi et al. | 204/192.29 |
| 2002/0011264 A1 * | 1/2002 | Saito | 136/258 |
| 2005/0224108 A1 * | 10/2005 | Cheung | 136/251 |
| 2007/0169808 A1 * | 7/2007 | Kherani et al. | 136/258 |

FOREIGN PATENT DOCUMENTS

| | | |
|---|---|---|
| JP | 63-122283 | 5/1998 |
| JP | 2002-94089 | 3/2002 |
| JP | 2004-214565 | 7/2004 |
| JP | 2004-336086 | 11/2004 |
| KR | 2007-0004671 | 1/2007 |

* cited by examiner

*Primary Examiner* — Jennifer K. Michener
*Assistant Examiner* — Eli Mekhlin
(74) *Attorney, Agent, or Firm* — Lee & Morse, P.C.

(57) ABSTRACT

A photovoltaic device and a manufacturing method thereof are provided. The photovoltaic device includes: a substrate; a first conductive layer formed on the substrate; P layers and N layers alternately formed along a first direction on the first conductive layer; and I layers covering the P layers and the N layers on the first conductive layer, wherein the P layers and the N layers are separated from each other by a first interval, the I layers are formed between the P layers and the N layers that are separated by the first interval, and the P layers, the I layers, and the N layers formed along the first direction form unit cells.

19 Claims, 10 Drawing Sheets

PHOTOVOLTAIC DEVICE AND METHOD FOR MANUFACTURING THE SAME

CROSS-REFERENCE TO RELATED APPLICATION

This application claims priority to and the benefit of Korean Patent Application No. 10-2008-0104295 filed in the Korean Intellectual Property Office on Oct. 23, 2008 and Korean Patent Application No. 10-2008-0110615 filed in the Korean Intellectual Property Office on Nov. 7, 2008, the entire contents of which are incorporated herein by reference.

BACKGROUND OF THE INVENTION (a) Field of the Invention

The present invention relates to a photovoltaic device and a manufacturing method thereof.

(b) Description of the Related Art

A solar cell is one kind of photovoltaic device for converting light energy into electrical energy, and is used as a core element for developing solar light. The solar cell is a diode consisting of a PN junction, and may be classified into various kinds according to the material used as a light absorption layer.

A solar cell using silicon as the light absorption layer may be classified as a crystalline (monocrystalline and polycrystalline) solar cell, a substrate solar cell, and a thin film (crystalline and amorphous) solar cell. Also, a representative solar cell may be a compound thin film solar cell using CIGS (CuInGaSe2) or CdTe, a III-V group solar cell, a dye response solar cell, and an organic solar cell.

The thin film solar cell is formed by coating a film onto a substrate based on thin glass or plastic. With the common thin film solar cell, the diffusion distance of carriers is very short due to the characteristic of the thin film compared to that of the crystalline silicon solar cells, and if it is fabricated only with the PN junction structure, the collection efficiency of electron-hole pairs generated by the sunlight is significantly lowered. Therefore, the thin film solar cell has a PIN structure where an intrinsic semiconductor-based light absorbing layer with high light absorption is interposed between the P-type and N-type semiconductors. The common thin film solar cell has a structure where a front transparent conductive film, a PIN layer, and a rear reflective electrode layer are sequentially deposited on a substrate. In this structure, the light absorbing layer is depleted due to the overlying P and underlying N layers with a high doping concentration so that an electric field is generated therein. As a result, among the carriers generated in the light absorbing layer by sunlight, the electrons are collected at the N layer and the holes at the P layer by way of drift of the internal electric field, thereby generating an electric current.

However, when the PIN layer is formed in the vertical direction, several laser patternings are executed to the cells when connecting the electrodes of the P layer and the N layer of different cells such that layer damage may be generated and a remaining layer is generated on the side, thereby generating pattern deterioration. Accordingly the efficiency of the solar cell may be reduced.

The above information disclosed in this Background section is only for enhancement of understanding of the background of the invention and therefore it may contain information that does not form the prior art that is already known in this country to a person of ordinary skill in the art.

SUMMARY OF THE INVENTION

Accordingly, the present invention improves an interface characteristic of a solar cell, and increases photovoltaic efficiency thereof.

Also, the present invention improves photo-efficiency by connecting neighboring light absorption layers, suppresses the generation of a lateral leakage current, and improves durability of connection electrodes formed on the light absorption layers.

A photovoltaic device according to an embodiment of the present invention includes: a substrate; a first conductive layer formed on the substrate; P layers and N layers alternately formed according to a first direction on the first conductive layer; and I layers covering the P layers and the N layers on the first conductive layer, wherein the P layers and the N layers are separated from each other by a first interval, the I layers are formed between the P layers and the N layers that are separated by the first interval, and the P layers, the I layers, and the N layers formed according to the first direction form unit cells.

The first direction may be the same as a direction in which carriers are moved.

The first interval may be in the range of 0.3 um to 2 um.

The unit cells formed according to the first direction may be electrically connected to each other through the first conductive layer.

The unit cells formed according to the first direction may be separated from each other by a second interval that is wider than the first interval.

A depletion layer formed between the unit cells separated by the second interval may be further included.

The unit cells formed on the substrate may be arranged into a plurality of columns according to the first direction, and unit cells arranged in neighboring columns are separated by a third interval that is wider than the first interval.

The P layers and the N layers may include at least one of amorphous silicon (a-Si), micro-crystalline silicon (mc-Si), and amorphous silicon carbide (a-SiC).

The I layers may be made of amorphous silicon (a-Si) or amorphous silicon germanium (a-SiGe).

The first conductive layer may be made of a transparent conductive layer or a reflective layer.

A second conductive layer formed on the I layers may be further included.

A manufacturing method of a photovoltaic device according to another embodiment of the present invention includes: forming a conductive layer on a substrate; alternately forming P layers and N layers according to a first direction on the conductive layer; patterning the P layers and the N layers to be separated by a first interval; and forming I layers covering the P layers and the N layers on the conductive layer and filling between the P layers and the N layers to separate them.

The alternately forming of the P layers and the N layers may be performed using a mask.

The patterning of the P layers and the N layers may be performed using laser scribing or wheel scribing.

The patterning of the P layers and the N layers may be performed using chemical etching.

The patterning of the P layers and the N layers may include selectively etching a conductive layer along with the P layers and the N layers for the P layers and the N layers to be separated by a first interval of 0.3 um to 2 um.

The patterning of the P layers and the N layers may include forming unit cells separated from each other by a second interval that is wider than the first interval when defining the P layers and the N layers that are separated by the first interval as unit cells.

The patterning of the P layers and the N layers may include arranging the unit cells in a plurality of columns according to the first direction on the substrate, and selectively etching the P layer, the N layer, and the conductive layer for the unit cells to be separated by a third interval that is wider than the first interval.

The alternately forming of the P layers and the N layers may further include forming a depletion layer between the unit cells that are separated from each other when defining the P layers and the N layers that are separated by the first interval as unit cells.

A photovoltaic device according to an embodiment of the present invention includes: a first cell including a lower first conductive layer, a first light absorption layer, and an upper second conductive layer sequentially deposited on a substrate; and a second cell neighboring the first cell and including a lower second conductive layer, a second light absorption layer, and an upper first conductive layer sequentially deposited on the substrate, wherein the first light absorption layer and the second light absorption layer are formed at the same layer and are connected each other.

The lower first conductive layer of the first cell and the lower second conductive layer of the second cell may be separated from each other, and a light absorption layer may be further included.

The upper second conductive layer of the first cell and the upper first conductive layer of the second cell may be formed with the same layer as the first and second light absorption layers, and may be electrically disconnected each other.

A depletion region formed between the upper second conductive layer of the first cell and the upper first conductive layer of the second cell may be further included.

An electrode portion formed between the upper second conductive layer of the first cell and the upper first conductive layer of the second cell may be further included.

The electrode portion may include protrusions and depressions, and a flat portion, and the width of the flat portion may be substantially equal to or less than the width between the lower first conductive layer of the first cell and the lower second conductive layer of the second cell.

The upper second conductive layer of the first cell and the upper first conductive layer of the second cell may be formed with the same layer as the first and second light absorption layers, and are separated from each other.

A non-conductive member formed between the upper second conductive layer of the first cell and the upper first conductive layer of the second cell may be further included.

A first electrode formed between the substrate, and the lower first conductive layer of the first cell and the lower second conductive layer of the second cell, may be further included.

A second electrode formed between the upper second conductive layer of the first cell and the upper first conductive layer of the second cell, and on a portion therebetween, may be further included.

The two neighboring cells may be connected by the first electrode when the first cell and the second cell connected by the second electrode are a pair of cells.

The lower first conductive layer and the lower second conductive layer may be maintained between two neighboring pairs of cells.

A manufacturing method of a photovoltaic device according to an embodiment of the present invention includes: forming a lower first conductive layer and a lower second conductive layer on a substrate; forming a light absorption layer on the lower first conductive layer and the lower second conductive layer; forming an upper first conductive layer and an upper second conductive layer on the light absorption layer; forming an upper electrode on the upper first conductive layer and the upper second conductive layer; and patterning the upper electrode layer, the upper first conductive layer, the upper second conductive layer, and the light absorption layer to form a first cell and a second cell forming a pair of cells connected by the upper electrode layer.

The method may further include forming a lower electrode on the substrate before forming the lower first conductive layer and the lower second conductive layer on the substrate.

The pair of cells including the first cell and the second cell may be connected by the lower electrode.

The lower first conductive layer and the lower second conductive layer may be maintained between the pair of cells including the first cell and the second cell.

The forming of the lower first conductive layer and the lower second conductive layer on the substrate may include forming a first semiconductor layer on the substrate, respectively injecting a first impurity and a second impurity having an opposite polarity to that of the first impurity to two neighboring regions of the first semiconductor layer by using a mask, and patterning the first semiconductor injected with the first impurity and the second impurity.

The forming of the lower first conductive layer and the lower second conductive layer on the substrate may include selectively forming a semiconductor including the first impurity at the first region on the substrate and a semiconductor including the second impurity at the second region on the substrate by using a mask.

A depletion region may be formed between the upper first conductive layer and the upper second conductive layer.

The method may further include removing a portion of the region between the upper first conductive layer and the upper second conductive layer, and forming a non-conductive member before forming the upper first conductive layer and the upper second conductive layer on the light absorption layer.

The forming of the upper first conductive layer and the upper second conductive layer on the light absorption layer may include forming a second semiconductor layer on the light absorption layer, and respectively injecting a first impurity and a second impurity having an opposite polarity to that of the first impurity to two neighboring regions of the first semiconductor layer by using a mask. The forming of the upper first conductive layer and the upper second conductive layer on the light absorption layer may include selectively forming a semiconductor including the first impurity at the first region on the substrate and a semiconductor including the second impurity at the second region on the substrate by using a mask.

According to the present invention, the number of laser scribes may be reduced, thereby reducing the manufacturing cost of the solar cell and improving the interface characteristic of the solar cell, and as a result the efficiency of the photovoltaic device may be increased.

Also, light absorption layers between the neighboring cells are connected thereby improving photo-efficiency, and the light absorption layers are filled in the separation spaces between the neighboring cells such that impurity adhesion or chemical contamination that may be generated during the process is prevented, thereby suppressing a leakage current of the side surface thereof. Also, the connection electrode between the cells is not floated on the light absorption layer,

DETAILED DESCRIPTION OF THE EMBODIMENTS

The present invention will be described more fully hereinafter with reference to the accompanying drawings, in which embodiments of the invention are shown. However, the present invention is not limited to embodiments described herein, and may be embodied in other forms. Rather, embodiments described herein are provided to thoroughly and completely understand the disclosed contents and to sufficiently transfer the ideas of the present invention to a person of ordinary skill in the art.

In the drawings, the thicknesses of layers and regions are exaggerated for clarity. It is to be noted that when a layer is referred to as being "on" another layer or substrate, it can be directly formed on the other layer or substrate or can be formed on the other layer or substrate with a third layer interposed therebetween. Like constituent elements are denoted by like reference numerals throughout the specification.

Figure 1:
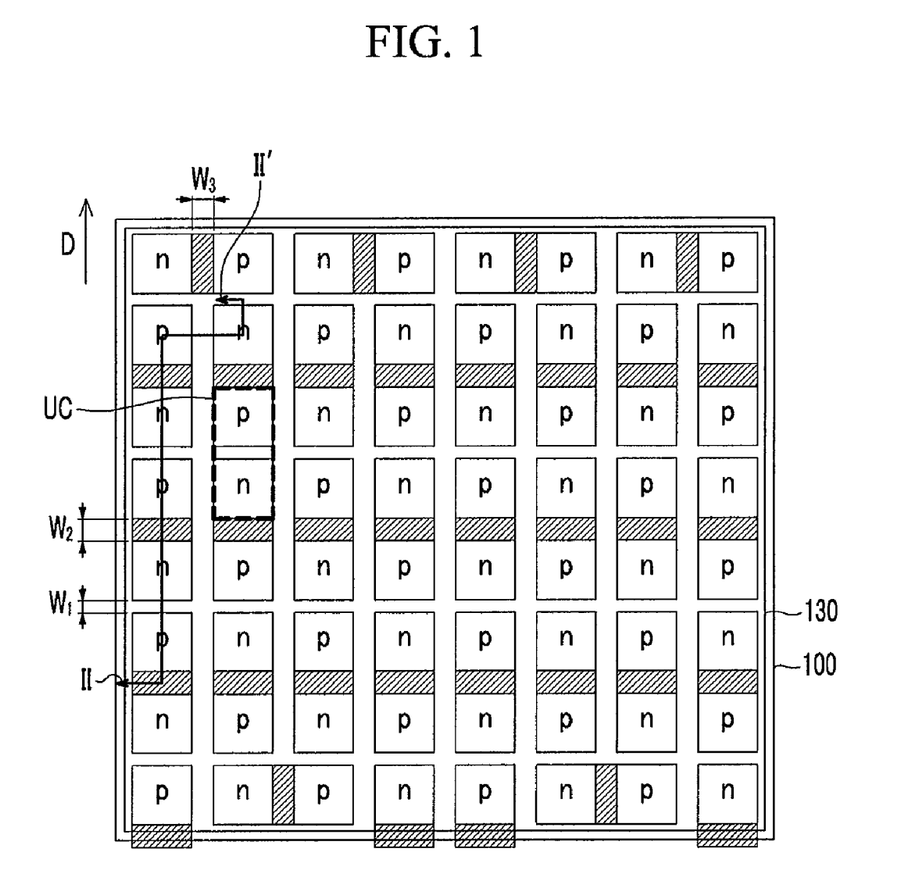
FIG. 1 is a top plan view of a photovoltaic device according to an embodiment of the present invention.
Figure 2:
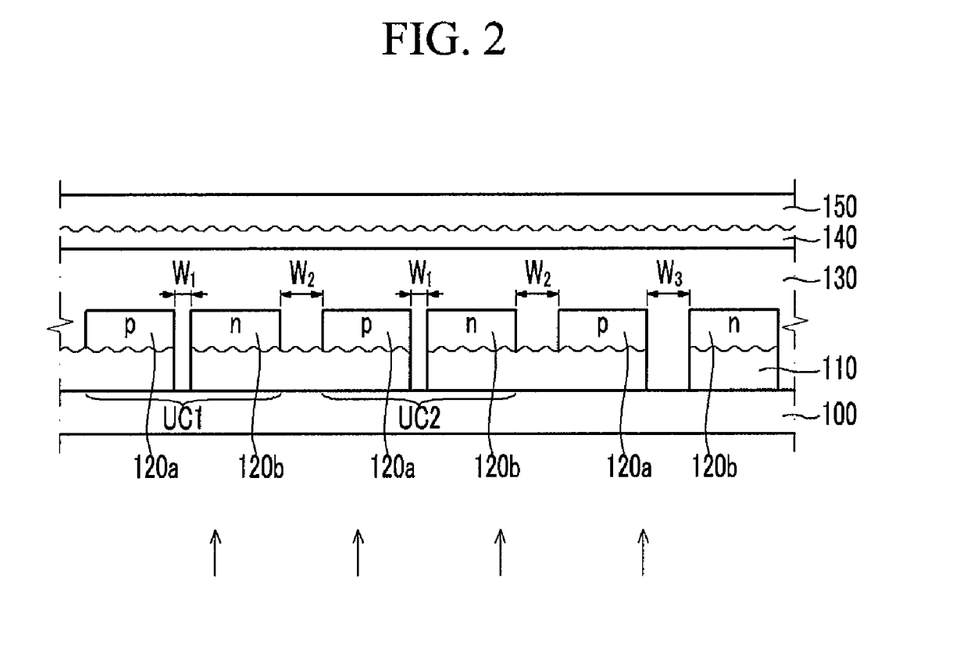
FIG. 2 is a cross-sectional view taken along the line II-II' shown in FIG. 1.

FIG. 1 is a top plan view of a solar cell according to an embodiment of the present invention. FIG. 2 is a cross-sectional view taken along the line II-II' shown in FIG. 1.

Referring to FIG. 1 and FIG. 2, a transparent conductive layer 110 is formed on a substrate 100. An upper surface of the transparent conductive layer 110 is textured.

The texturing means that, for the purpose of increasing a valid light amount absorbed to the inside of the solar cell by reducing light amount reflected from the solar cell surface, the upper surface of the first transparent conductive film 110 is formed with periodic pyramidal structures, for example within a size of 10 μm by undergoing an etching process.

The transparent conductive layer 110 may be made of $SnO_2$, ZnO:Al, ZnO:B, indium tin oxide (ITO), or indium zinc oxide (IZO) in one example.

P layers 120a including impurities of a P type and N layers 120b including impurities of an N type are alternately formed in a first direction D on the transparent conductive layer 110. The first direction D may be defined as a direction that the carriers are moved, that is, the direction that the electric field generated for the solar cell by absorbing the light is moved.

The P layers 120a may be made of one of boron-doped amorphous silicon (a-Si), amorphous silicon carbide (a-SiC), and microcrystalline silicon (mc-Si). The N layers 120b may be made of one of phosphorus-doped amorphous silicon (a-Si), amorphous silicon carbide (a-SiC), and microcrystalline silicon (mc-Si).

An I layer 130 covering the P layers 120a and the N layers 120b is formed on the transparent conductive layer 110. The I layer 130 is made of an intrinsic semiconductor, functions as a light absorption layer, and generates an electric field to form a path through which the carrier is moved from the P layer 120a to the N layer 120b.

Each P layer 120a and N layer 120b are separated from each other with a first interval W1 therebetween, and the I layer 130 is formed in the first interval W1. Accordingly, in the solar cell according to an embodiment of the present invention, a P layer 120a, the I layer 130, and an N layer 120b form a unit cell UC in a lateral direction. In the unit cell UC, the upper surface and the side surfaces of the P layer 120a and the N layer 120b are enclosed by the I layer 130. The I layer 130 is made of amorphous silicon, thereby protecting the surfaces of the P layer 120a and the N layer 120b, functions as an insulator thereby preventing a leakage current, and improves the interface characteristic, thereby improving the efficiency of the solar cell.

In one example, the first interval W1 is in the range of 0.3 um to 2 um. When the I layer 130 is formed of the amorphous silicon, if the first interval W1 is less than 0.3 um, the light conversion efficiency may be reduced by electron-hole recombination. When the I layer 130 is formed of the amorphous silicon, it is preferable that the first interval W1 is less than 2 um. However, when the degree of crystallization of the I layer 130 is improved to the degree of monocrystallinity, it is possible for the first interval W1 to be more than 2 um.

The unit cell UC is formed along the first direction D, the transparent conductive layer 110 is not formed between the P layer 120a and the N layer 120b in the unit cell UC, and the I layer 130 is filled therein.

The unit cells UC formed according to the first direction D are electrically connected to each other through the transparent conductive layer 110. In detail, the neighboring unit cells UC according to the first direction D have a second interval W2 therebetween. In the portion connecting the neighboring unit cells UC, the transparent conductive layer 110 formed under the P layer 120a and the N layer 120b is not disconnected. The second interval W2 may be relatively wider than the first interval W1. In the connection portion of the unit cells UC that are connected through the transparent conductive layer 110, the interval W2 between the P layer 120a and the N layer 120b is relatively wider than the interval W1 between the P layer 120a and the N layer 120b in each unit cell UC such that the P layer 120a and the N layer 120b form a PIN diode through the I layer 130. In another embodiment, the P layer 120a and the N layer 120b overlap each other and are doped on the portion connecting the neighboring unit cells UC, thereby being formed as a depletion layer. The depletion layer represents a non-conductive layer.

In one example, the second interval W2 is in the range of 10 um to 100 um.

The unit cells UC formed on the substrate 100 are disposed in a plurality of columns along the first direction D. The unit cells UC respectively formed in neighboring columns are separated from each other by a third interval W3. The third interval W3 is larger than the interval W1 between the P layer 120a and the N layer 120b in the unit cell UC so as to not generate an interaction between the neighboring unit cells UC disposed in a direction intersecting the first direction D.

In one example, the third interval W3 may be in the range of 10 um to 100 um. A rear conductive layer 140 is formed on the I layer 130. The rear conductive layer 140 may be made of indium tin oxide (ITO) or indium zinc oxide (IZO) in one example. The surface of the rear conductive layer 140 is textured. The rear conductive layer 140 functions to increase the light absorption rate by increasing a path through which the light is absorbed.

A reflective layer 150 is formed on the rear conductive layer 140. In an embodiment of the present invention, the rear conductive layer 140 and the reflective layer 150 function as an electrode in the solar cell of the vertical type. However, the current flows in the sequence of the transparent conductive layer 110, the P layer 120a, the I layer 130, the N layer 120b, and the transparent conductive layer 110 in the horizontal direction such that the reflective layer 150 does not function as the electrode in an embodiment of the present invention, but functions to reflect the incident light through the substrate 100.

FIG. 3 to FIG. 6 are cross-sectional views showing a manufacturing method of a solar cell according to an embodiment of the present invention.

Figure 3:
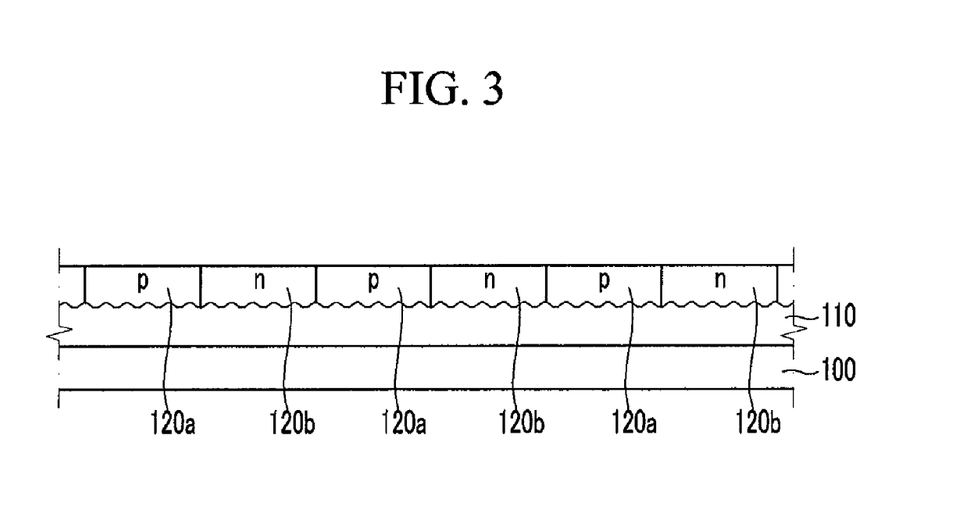
FIG. 3 to FIG. 6 are cross-sectional views showing a manufacturing method of a photovoltaic device according to an embodiment of the present invention.

Referring to FIG. 3, a transparent conductive layer 110 is deposited on a substrate 100. The transparent conductive layer 110 may be made of $SnO_2$, ZnO:Al, ZnO:B, indium tin oxide (ITO), or indium zinc oxide (IZO). The upper surface of the transparent conductive layer 110 is etched to texture the upper surface. P layers 120a and N layers 120b are alternately formed according to a first direction D on the transparent conductive layer 110. Next, various methods of alternately forming the P layer 120a and the N layer 120b will be described in detail.

First, to alternately form the P layer 120a and the N layer 120b, first regions and second regions that are alternately disposed according to the first direction D are defined on the transparent conductive layer 110. Next, the P layers 120a are deposited in the first regions after covering the second regions by using a mask. In one example, the P layers 120a may be deposited through plasma enhanced chemical vapor deposition (PECVD). Next, the N layers 120b are deposited in the second regions after covering the first regions by using a mask. The N layers 120b may also be deposited through plasma enhanced chemical vapor deposition (PECVD).

In another method, an amorphous silicon layer is firstly formed on the transparent conductive layer 110, and P-type ions are injected on the whole surface of the amorphous silicon layer. Next, a portion where the P layers 120a will be formed is covered and a portion where the N layers 120b will be formed is exposed by using a mask, and an N-type impurity is injected with a high concentration and thereby the P layers 120a and the N layers 120b are alternately formed.

In another method, an amorphous silicon layer is first formed on the transparent conductive layer 110, a portion where the N layers 120b will be formed is covered and a portion where the P layers 120a will be formed is exposed by using a mask, and the P-type impurity is injected to form the P layers 120a. Next, the portion where the P layers 120a will be formed is covered and the portion where the N layers 120b will be formed is exposed by using a mask, and the N-type impurity is injected to form the N layers 120b.

In another method, an amorphous silicon layer doped with the P-type impurity is deposited on the transparent conductive layer 110 through plasma enhanced chemical vapor deposition (PECVD). Next, a mask is disposed on the amorphous silicon layer doped with the P-type impurity to cover the portion where the P layers 120a will be formed, and N-type ions are injected to form the N layers 120b. The layer of the P type is changed to the I layer according to the injection of the N-type ions, and is then changed to the N-type layer. Accordingly, the P layers 120a and the N layers 120b may be alternately formed according to the first direction D.

Figure 4:
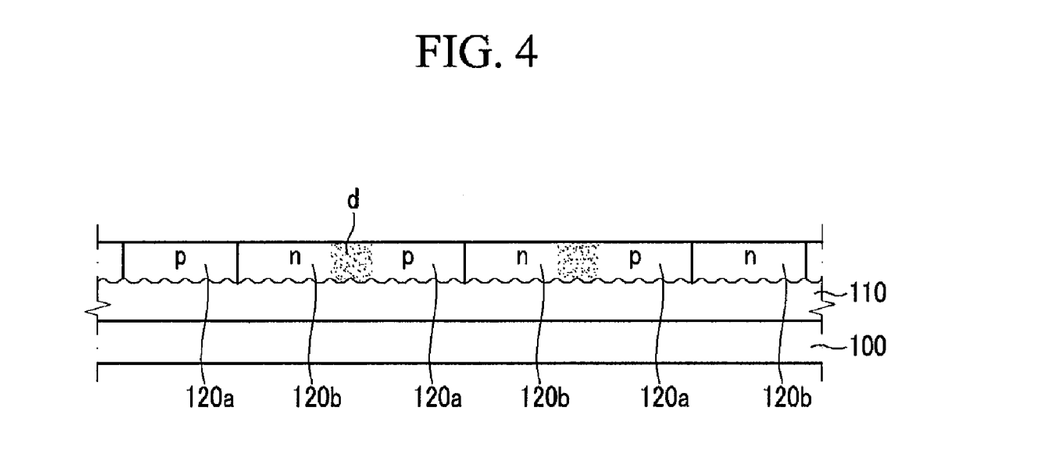

FIG. 4 is a cross-sectional view explaining a method for alternately forming the P layers 120a and the N layers 120b according to another embodiment.

Referring to FIG. 1 and FIG. 4, depletion layers d between the unit cells UC are formed with the second interval W2. When forming the P layers 120a and the N layers 120b by using the plasma enhanced chemical vapor deposition (PECVD) or the ion injection method, the P layers 120a and the N layers 120b may be formed to overlap each other in the portion where the unit cells UC1 and the unit cells UC2 are connected to each other. If the portion where the unit cells UC are connected is formed as an electrically non-conductive depletion layer, it is not necessary for the portion connecting the unit cells UC to be subsequently removed by using laser scribing.

Figure 5:
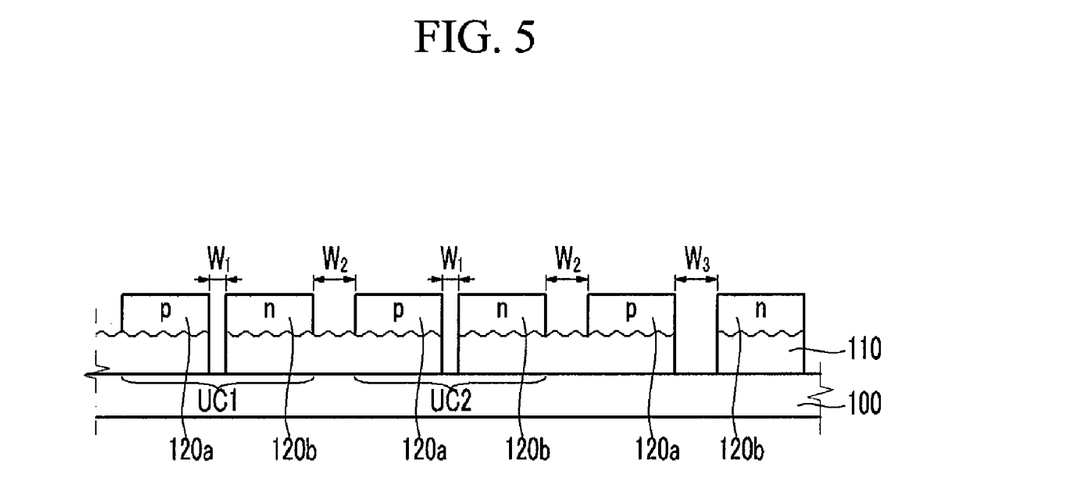

Next, as shown in FIG. 5, the P layers 120a and the N layers 120b are patterned to separate the P layers 120a and N layers 120b neighboring each other by a predetermined interval. Patterning the P layers 120a and the N layers 120b is a process of connecting the electrodes while forming the unit cells UC. In one example, the region where the P layer 120a and the N layer 120b neighbor each other may be patterned by laser scribing, wheel scribing, or chemical etching.

In the unit cell UC, the P layer 120a and the N layer 120b are patterned to have the interval W1. The first interval W1 is formed to be in the range of 0.3 um to 2 um. The unit cells UC formed according to the first direction D are patterned for the interval therebetween to be the second interval W2. The second interval W2 may be wider than the first interval W1. The second interval W2 may be in the range of 10 um to 100 um.

The transparent conductive layer 110 may be selectively patterned at the same time as the P layer 120a and the N layer 120b. In detail, as shown in FIG. 5, in the case of the portion where the unit cell UC1 and the unit cell UC2 are connected, the transparent conductive layer 110 is left as it is, and the regions neighboring the P layer 120a and the N layer 120b in each unit cell UC are selectively patterned. Accordingly, the unit cells UC1 and UC2 are electrically connected to each other through the transparent conductive layer 110. In the regions consisting of the unit cells UC1 and UC2, the transparent conductive layer 110 is simultaneously patterned along with the P layer 120a and the N layer 120b. When using laser scribing, the wavelength and the output of the laser are controlled for etching, and an appropriate etchant is selected when using the chemical etching process, so it is thereby possible to execute the above-explained patterning.

The unit cells UC formed on the substrate 100 are disposed along the first direction D with the plurality of columns. The unit cells UC are patterned to have the third interval W3 between the unit cells UC formed in neighboring columns. The third interval W3 is relatively wider than the first interval W1 so as to not generate an interaction between neighboring unit cells UC. The third interval W3 may be in the range of 10 um to 100 um.

Figure 6:
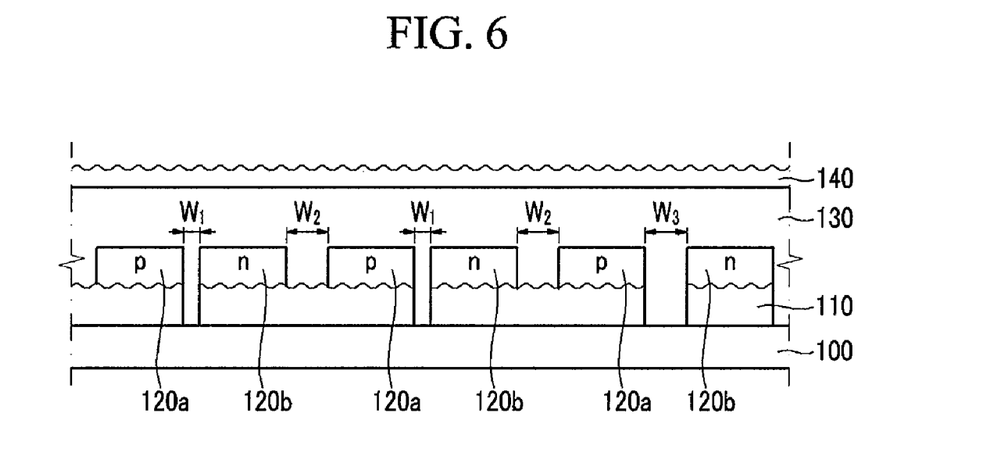

Referring to FIG. 6, an I layer 130 covering the P layer 120a and the N layer 120b is deposited on the transparent conductive layer 110. The I layer 130 may be made of amorphous silicon. The I layer 130 may be formed through plasma enhanced chemical vapor deposition (PECVD).

The deposited I layer 130 functions as a light absorption layer, and the P layer 120a, the I layer 130, and the N layer 120b are connected to form a diode according to the side direction.

A rear conductive layer 140 is formed on the I layer 130. The upper surface of the rear conductive layer 140 may be etched, thereby forming a texture. The rear conductive layer 140 increases a path through which the light is absorbed, thereby increasing the light absorption rate.

A reflective layer 150 is deposited on the rear conductive layer 140 as shown in FIG. 2, thereby forming the solar cell shown in FIG. 1.

Figure 7:
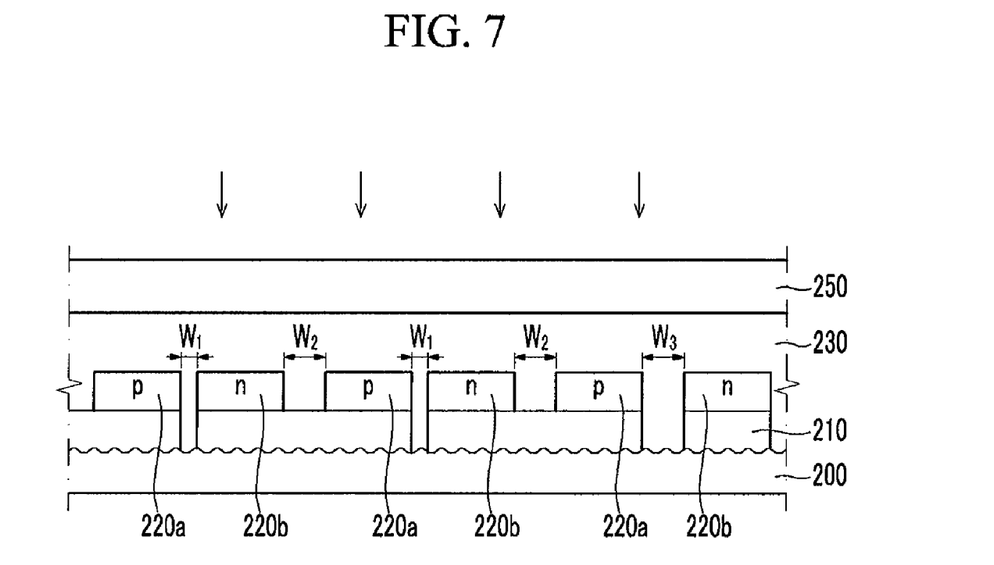
FIG. 7 is a cross-sectional view o a photovoltaic device according to another embodiment of the present invention.

FIG. 7 is a cross-sectional view showing a solar cell according to another embodiment of the present invention.

A solar cell of a substrate structure will now be explained. Light is incident through the substrate in the solar cell of the superstrate structure, however the light is incident on the side opposite to the substrate in the solar cell of the substrate structure. Hereafter, referring to FIG. 7, the solar cell of the substrate structure according to the current embodiment of the present invention will be described.

The solar cell of the substrate structure according to an embodiment of the present invention has the same planar shape as the solar cell of the superstrate according to an embodiment of the present invention, and FIG. 1 is again referred to. However, the reference numerals 100 of the substrate and 130 of the I layer of FIG. 1 are replaced with the reference numerals 200 for the substrate and the 230 for the I layer in the solar cell of the superstrate structure according to the current embodiment of the present invention.

Referring to FIG. 1 and FIG. 7, a reflecting electrode layer 210 is formed on a substrate 200. P layers 220a including impurities of a P type and N layers 220b including impurities of an N type are alternately formed along a first direction D on the reflecting electrode layer 210. The first direction D may be defined as a direction in which the carriers are moved, that is, the direction that the electric field generated for the solar cell by absorbing the light is moved.

An I layer 230 covering the P layers 220a and the N layers 220b are formed on the reflecting electrode layer 210. The I layer 230 is made of an intrinsic semiconductor, and is a path through which the carriers are moved from the P layer 220a to the N layer 220b by generating the electric field to the light absorption layer.

In the solar cell according to an embodiment of the present invention, the reflecting electrode layer 210 is used as the electrode of the N layer 220b in the P layer 220a, and simultaneously functions as the reflective layer. The reflecting electrode layer 210 may be made of a metal material.

The P layers 220a including impurities of a P type and the N layers 220b including impurities of an N type are alternately formed along the first direction D on the reflecting electrode layer 210. The first direction D may be defined as a direction that the carriers are moved, that is, the direction that the electric field generated for the solar cell by absorbing the light is moved.

An I layer 230, covering the P layers 220a and the N layers 220b, is formed on the reflecting electrode layer 210. The I layer 230 is made of an intrinsic semiconductor, and is a path through which the carriers are moved from the P layer 220a to the N layer 220b by generating the electric field to the light absorption layer.

Each P layer 220a and N layer 220b are separated by the first interval W1 therebetween, and the I layer 230 is formed in the first interval W1. Accordingly, in the solar cell of the substrate structure according to an embodiment of the present invention, the P layer 220a, the I layer 230, and the N layer 220b form unit cells UC along the side, like the solar cell of the superstrate structure.

In the unit cells UC, the upper surface and the side surfaces of the P layer 220a and the N layer 220b are enclosed by the I layer 230. The I layer 230 is made of an amorphous layer such that it functions as a surface passivation layer of the P layer 220a and the N layer 220b, prevents a leakage current, and improves the interface characteristic, thereby improving the efficiency of the solar cell.

The unit cells UC are formed along the first direction D, the reflecting electrode layer 210 is not formed between the P layer 220a and the N layer 220b in the unit cell UC, and the I layer 230 is filled therein.

The unit cells UC formed according to the first direction D are electrically connected to each other through the reflecting electrode layer 210. In detail, the unit cells UC neighboring each other along the first direction D are separated by the second interval W2. In the portion connecting the neighboring unit cells UC, the reflecting electrode layer 210 formed under the P layer 220a and the N layer 220b is not disconnected. The second interval W2 may be wider than the first interval W1. Accordingly, in the connection portion of the unit cells UC that are connected by the reflecting electrode layer 210, the interval W2 between the P layer 220a and the N layer 220b is wider than the interval W1 between the P layer 220a and the N layer 220b in each unit cell UC such that the P layer 220a and the N layer 220b form a PIN diode through the I layer 230.

The unit cells UC formed on the substrate 200 are disposed in a plurality of columns according to the first direction D. The unit cells UC respectively formed in neighboring columns are separated from each other by a third interval W3. The third interval W3 is larger than the interval W1 between the P layer 220a and the N layer 220b in the unit cell UC so as to not generate an interaction between the neighboring unit cells UC along the direction intersecting the first direction D.

A reflection prevention layer 250 is formed on the I layer 230. In the solar cell of the superstrate structure, the light is incident on the opposite side of the substrate 200, and the reflection prevention layer 250 protects the I layer 230 and does not reflect the incident light toward the I layer 230, and thus the reflection prevention layer 250 has the function of increasing the light absorption rate. In the solar cell of the superstrate structure according to an embodiment of the present invention, it is not necessary to additionally form the connection electrode on the reflection prevention layer 250 such that the problem that the area receiving the light is decreased by the connection electrode is solved, thereby increasing the light absorption rate.

Figure 8:
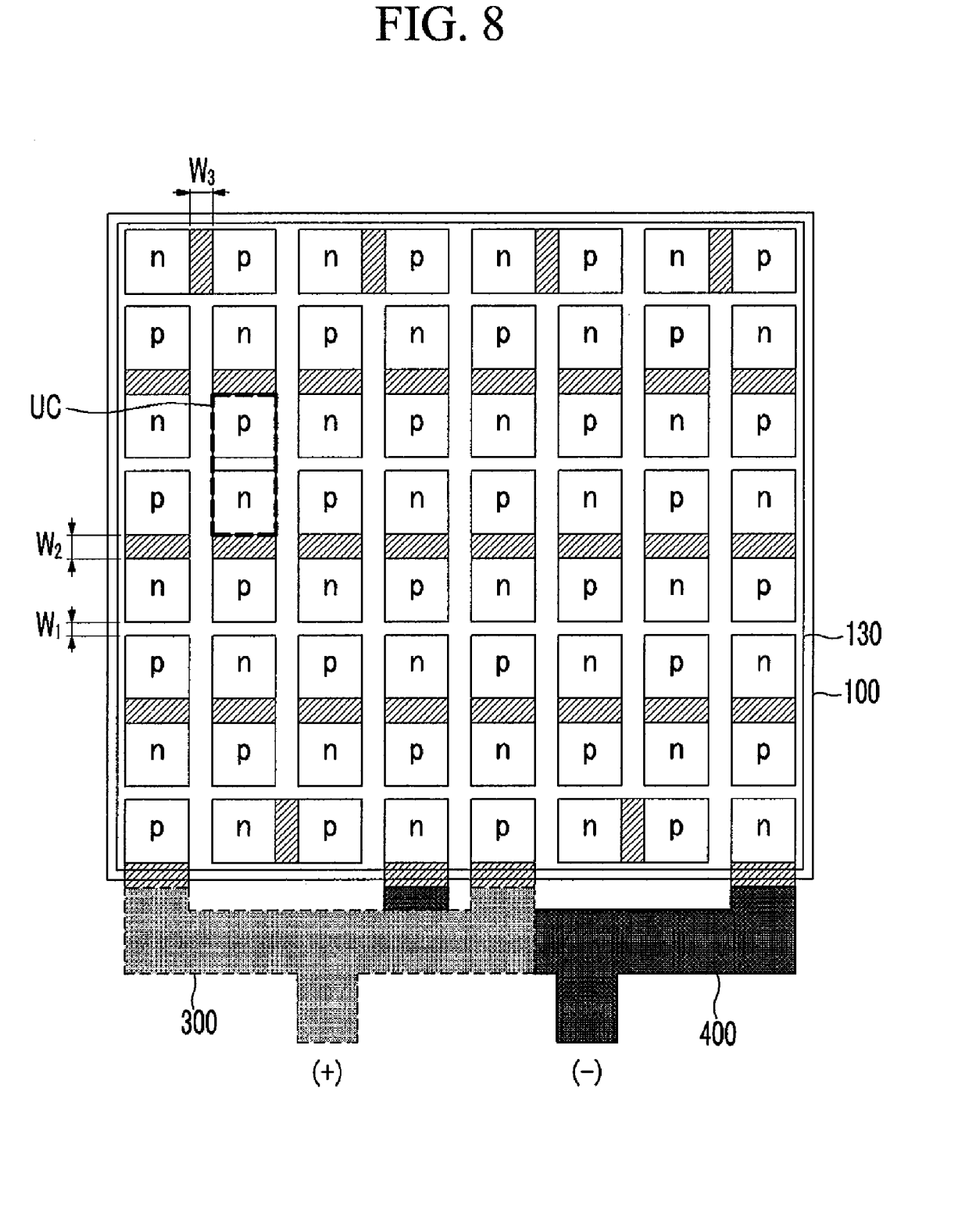
FIG. 8 and FIG. 9 are top plan views showing a structure forming an electrode in a photovoltaic device according to an embodiment of the present invention.
Figure 9:
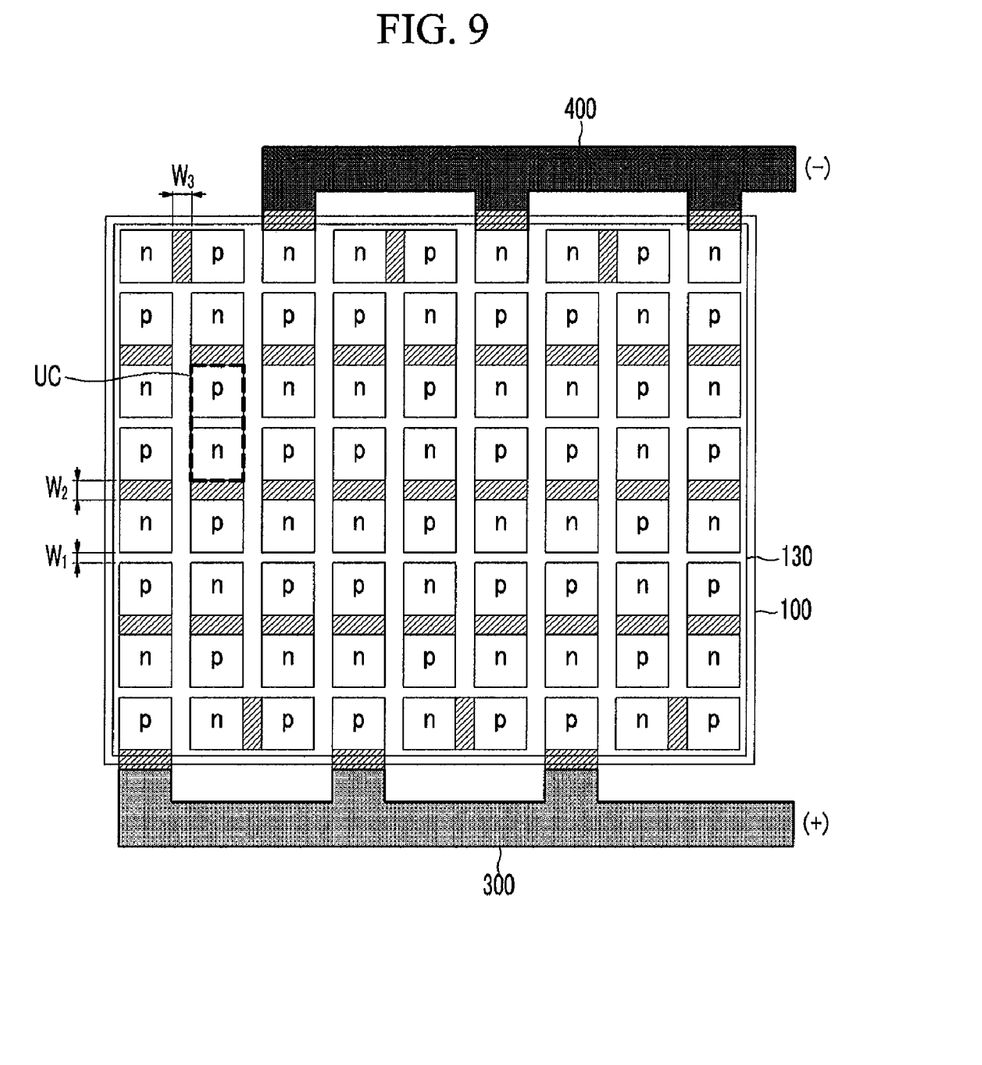

FIG. 8 and FIG. 9 are top plan views showing a structure forming an electrode in a photovoltaic device according to an embodiment of the present invention.

Referring to FIG. 8 and FIG. 9, the unit cells UC are basically connected in series with a zigzag shape. If all cells are connected in series under a module formation, an efficiency deterioration may occur when generating dead cells or deteriorated cells, and the solar cell may not operate in a serious case.

Accordingly, in the solar cell according to an embodiment of the present invention, connectors 300 and 400 connected to the edge of the transparent conductive layer are connected in parallel to several regions under the modulation process such that a short caused by dead cells and deteriorated cells, and consequent efficiency deterioration, may be prevented.

Also, the output voltage/current may be controlled according to the method of forming the connectors 300 and 400.

According to embodiments of the present invention, it is possible for the electrode and the unit cell to be formed through one patterning process such that interface defects and pattern deteriorations generated through the patterning process may be solved.

Figure 10:
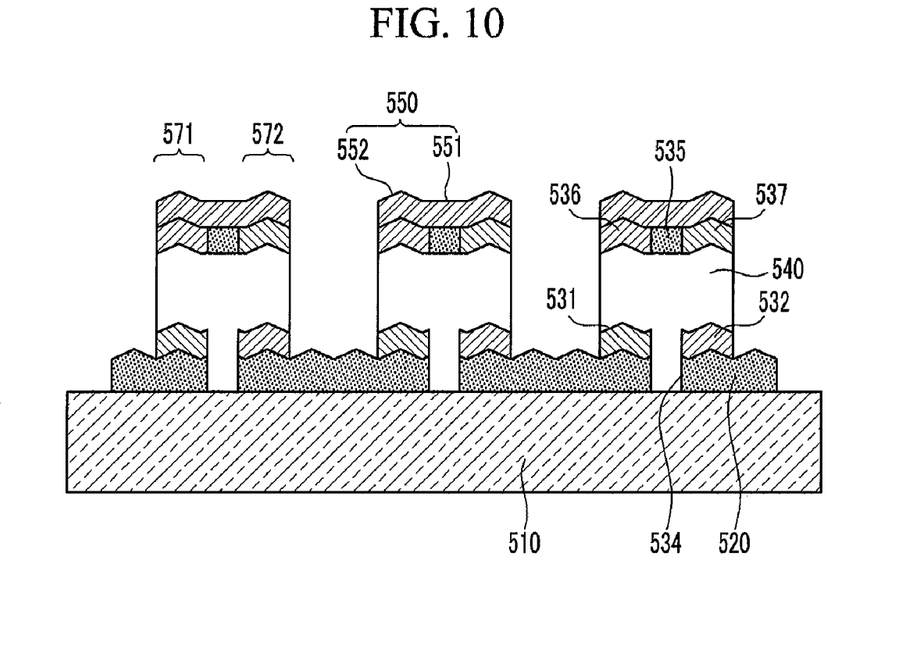
FIG. 10 is a cross-sectional view for explaining a photovoltaic device for a solar cell according to another embodiment of the present invention.

FIG. 10 is a cross-sectional view for explaining a photovoltaic device for a solar cell according to another embodiment of the present invention.

Referring to FIG. 10, a front electrode 520 is formed on a substrate 510. The substrate 510 is a hard substrate or a flexible substrate. For example, when the substrate is a hard substrate, it may include a glass plate, a quartz plate, a silicon plate, a plastic plate, or a metal plate. In another embodiment, when the substrate is a flexible substrate, it may include a metal sheet or a plastic sheet. As an example, the metal sheet may be a stainless sheet or aluminum foil.

The incident solar light is transmitted through the front electrode 520, which is made of a transparent conductive material having conductivity. Generally, the front electrode is made of a material that minimizes the deterioration of light transmittance and that has low resistivity and good surface roughness, such as a transparent conductive oxide (TCO) like ZnO:Al, ZnO:B, $SnO_2$, and ITO. To increase the efficiency of the incident light, texture of a predetermined height and size may be formed on the surface of the front electrode 520, for example by etching.

A lower first conductive layer 531 and a lower second conductive layer 532 having an opposite polarity to that of the lower first conductive layer 531 and that neighbor each other are formed on the front electrode 520. The lower first conductive layer 531 and the lower second conductive layer 532 are separated from each other through a patterning process. A contact hole 534 exposing the substrate 510 by passing through the front electrode 520 is formed between the lower first conductive layer 531 and the lower second conductive layer 532.

A light absorption layer 540 made of an intrinsic semiconductor material is formed on the lower first conductive layer 531 and the lower second conductive layer 532. Here, the light absorption layer 540 is connected with the substrate 510 through the contact hole 534, and separates the lower first conductive layer 531 and the lower second conductive layer 532 from each other.

An upper second conductive layer 536 and an upper first conductive layer 537 respectively corresponding to the lower first conductive layer 531 and the lower second conductive layer 532 are formed at the same layer on the light absorption layer 540 to neighbor each other. A region where the upper second conductive layer 536 and the upper first conductive layer 537 neighbor each other becomes a depletion region 535 by combining the electrons and holes of the impurities that have the different polarities and are injected to the upper second conductive layer 536 and the upper first conductive layer 537, and is non-conductive. It is possible for the depletion region 535 to be replaced with an insulating member made of an organic material.

A rear electrode 550 is formed on the upper second conductive layer 536, the depletion region 535, and the upper first conductive layer 537. The rear electrode 550 includes protrusions and depressions 552 and a flat portion 551, and the width of the flat portion 551 corresponds to the width of the contact holes 534 such that it is substantially equal to or less than the width of the contact holes 534. The rear electrode 550 is generally made of a material such as silver (Ag), and a reflective layer (not shown) may be included between the upper second conductive layer 536, the depletion region 535, and the upper first conductive layer 537, and the rear electrode 550.

When a first cell 571 and a second cell 572 connected through the rear electrode 550 are referred to as a pair of cells, two neighboring pairs of cells are connected by the front electrode 520.

In this way, the first cell 571 made of the lower first conductive layer 531, the light absorption layer 540, and the upper second conductive layer 536, and the second cell 572 made of the lower second conductive layer 532, the light absorption layer 540, and the upper first conductive layer 537, are formed with the same layer such that a cell having the same effect as the vertical deposition structure such as in tandem or triplet may be formed by being horizontally deposited. Particularly, the light absorption layer 540 is formed in the contact hole 534 between the lower first conductive layer 531 and the lower second conductive layer 532, and is connected on the boundary of the first cell 571 and the second cell 572 such that leakage current of the cell side generated by the adhesion of an impurity or chemical contamination may be reduced. Also, the light absorption layer formed on the boundary between two neighboring cells functions as a supplying source of the carriers such that the lifetime of the minority carrier of the cell increases, thereby improving the light efficiency.

Also, the connection electrode between the neighboring cells is disposed on the depletion region 535 formed between the upper second conductive layer 536 of the first cell 571, and the upper first conductive layer 537 of the second cell 572 is not floated but is contacted with the lower layer, such that the mechanical durability may be improved.

Figure 11:
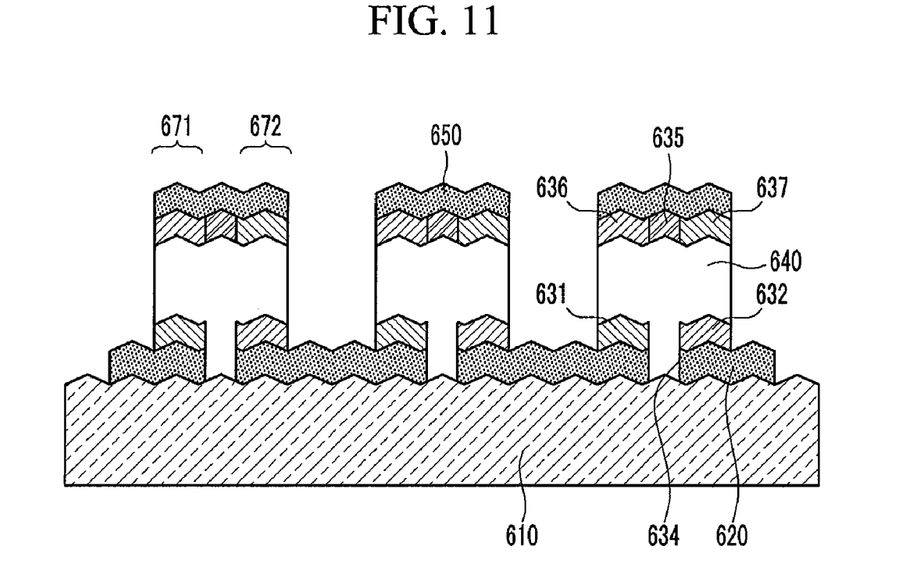
FIG. 11 is a cross-sectional view for explaining a photovoltaic device for a solar cell according to another embodiment of the present invention.

FIG. 11 is a cross-sectional view for explaining a photovoltaic device for a solar cell according to another embodiment of the present invention.

Referring to FIG. 11, a rear electrode 620 is formed on a substrate 610.

The surface of the substrate 610 may include protrusions and depressions to increase the reflection efficiency of solar light.

The rear electrode 620 is made of a metal having high reflectance, such as Mo.

A lower first conductive layer 631 and a lower second conductive layer 632 having an opposite polarity to that of the lower first conductive layer 631 and that neighbor each other are formed on the rear electrode 620. The lower first conductive layer 631 and the lower second conductive layer 632 are separated from each other through a patterning process. A contact hole 634 exposing the substrate 610 by passing through the rear electrode 620 is formed between the lower first conductive layer 631 and the lower second conductive layer 632.

A light absorption layer 640 made of an intrinsic semiconductor material is formed on the lower first conductive layer 631 and the lower second conductive layer 632. Here, the light absorption layer 640 is connected with the substrate 610 through the contact hole 634, and separates the lower first conductive layer 631 and the lower second conductive layer 632 from each other.

An upper second conductive layer 636 and an upper first conductive layer 637 respectively corresponding to the lower first conductive layer 631 and the lower second conductive layer 632 are formed with the same layer on the light absorption layer 640 to neighbor each other. The region where the upper second conductive layer 636 and the upper first conductive layer 637 neighbor each other becomes a depletion region 635 by combining the electrons and holes of impurities that have different polarities and are injected into the upper second conductive layer 636 and the upper first conductive layer 637, and is non-conductive. It is possible for the depletion region 635 to be replaced by an insulating member made of an organic material.

A front electrode 650 is formed on the upper second conductive layer 636, the depletion region 635, and the upper first conductive layer 637. A reflection prevention layer (not shown) may be included between the upper second conductive layer 636, the depletion region 635, and the upper first conductive layer 637, and the front electrode 650. The reflection prevention layer may be made of at least one material of silicon nitride, titanium oxide, and MgF2.

When a first cell 671 and a second cell 672 connected through the rear electrode 650 are referred to as a pair of cells, two neighboring pairs of cells are connected by the rear electrode 620.

Figure 12:
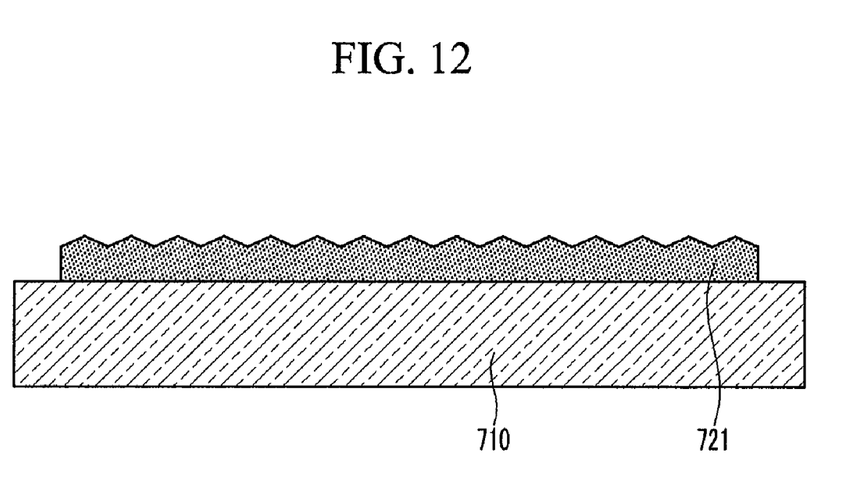
FIG. 12 to FIG. 14 are cross-sectional views showing a manufacturing method of a photovoltaic device for a solar cell according to another embodiment of the present invention.
Figure 13:
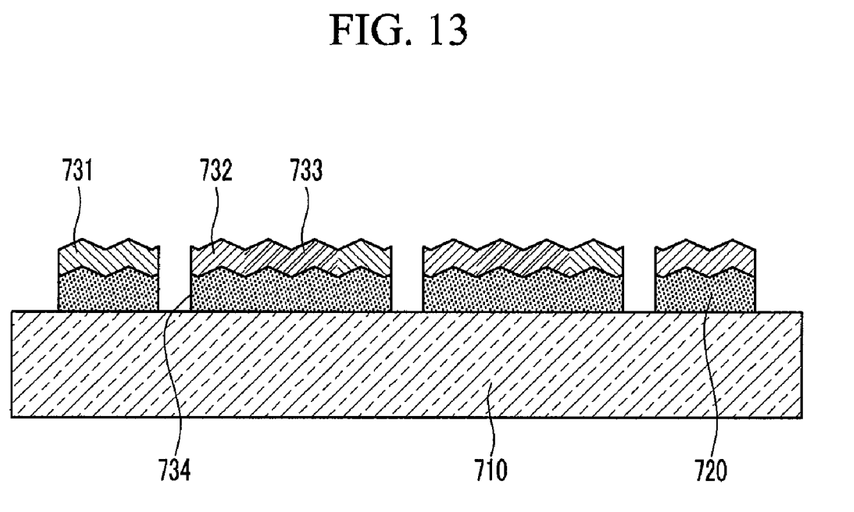
Figure 14:
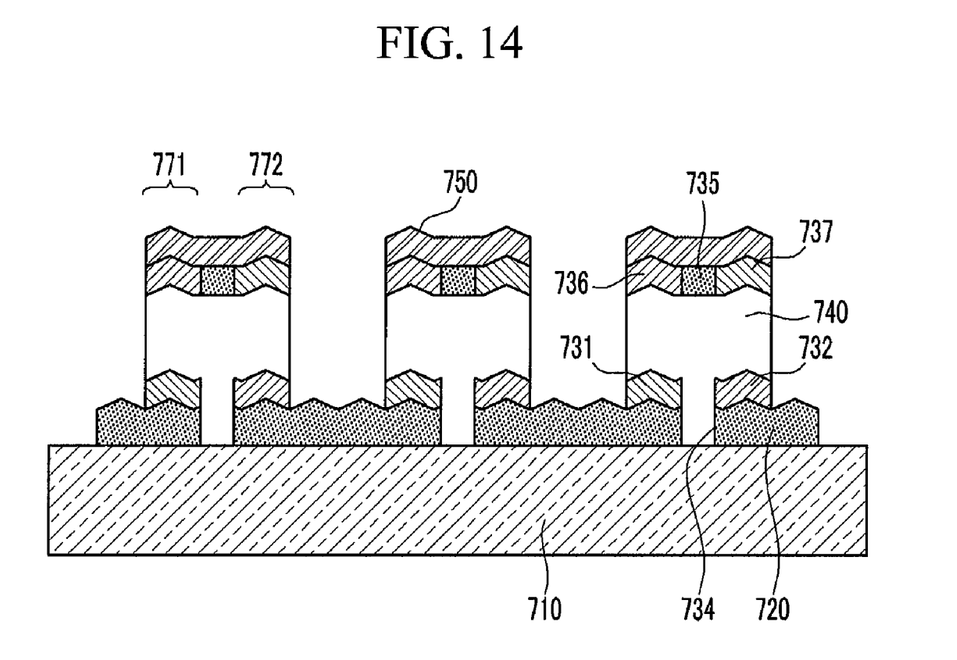

FIG. 12 to 14 are cross-sectional views showing a manufacturing method of a photovoltaic device for a solar cell according to another embodiment of the present invention.

FIG. 12 is a cross-sectional view showing a step of forming a front electrode 720 on a substrate 710.

Referring to FIG. 12, a front electrode layer 721 is formed on the substrate 710.

As an example, the front electrode layer 721 is formed through physical vapor deposition. The front electrode layer 721 is made of a material that is transparent and has conductivity, such as ZnO:Al, ZnO:B, SnO2, and indium tin oxide (ITO). To increase the efficiency of incident light, it is preferable that the surface thereof is textured to a predetermined height and size. For example, the texture may include an embossing pattern, protrusions and depressions, protrusions, recesses, grooves, or a prism pattern.

The front electrode layer 721 is patterned to form the front electrode 720. The patterning method may use laser scribing.

FIG. 13 is a cross-sectional view showing a step of forming a lower first conductive layer 731 and a lower second conductive layer 732 on the front electrode 720 formed by patterning the front electrode layer 721 shown in FIG. 12.

Referring to FIG. 13, the lower first conductive layer 731 and the lower second conductive layer 732 are formed to neighbor each other on the front electrode 720. Here, chemical vapor deposition may be used. A predetermined region is exposed by using a hard mask (not shown), and a thin film is deposited by using a deposition gas including a first impurity to thereby selectively form the lower first conductive layer 731 on the predetermined region. Next, a region adjacent to the lower first conductive layer 731 is exposed by using a hard mask, and a thin film is deposited by using a deposition gas including a second impurity having the opposite polarity to that of the first impurity, thereby selectively forming the lower second conductive layer 732 on the region adjacent to the lower first conductive layer 731. A region 733 that is not doped with an impurity may be present between the lower first conductive layer 731 and the lower second conductive layer 732.

As another method of forming the lower first conductive layer 731 and the lower second conductive layer 732, an intrinsic semiconductor layer that does not include an impurity is formed on the front electrode 720, and impurities having different polarities are injected to the neighboring regions by using a hard mask.

As another method of forming the intrinsic semiconductor layer that does not include the impurity on the front electrode 720, a laser is irradiated to the semiconductor layer under a gas atmosphere including an impurity such as PH3 or B2H6 such that the impurity in the gas atmosphere is reacted, thereby forming the lower first conductive layer 731 and the lower second conductive layer 732.

After forming the lower first conductive layer 731 and the lower second conductive layer 732, the boundary portion of the lower first conductive layer 731 and the lower second conductive layer 732, and the lower front electrode 720, are removed by using laser scribing such that a plurality of contact holes 734 exposing a portion of the substrate 710 are formed. The contact holes 734 may be formed in a ditch shape extending in one direction under the plane surface. Here, the boundary portions of the lower first conductive layer 731 and the lower second conductive layer 732 are removed while skipping one to form the conductive layer with the same polarity on the right side and the left side with respect to the contact holes 734.

FIG. 14 is a cross-sectional view showing formation of a light absorption layer 740, an upper second conductive layer 736, and an upper first conductive layer 737, as well as a rear electrode 750.

Referring to FIG. 14, the light absorption layer 740 is formed on the substrate 710 formed with the front electrode 720, the lower first conductive layer 731, and the lower second conductive layer 732, and in the contact holes 734, through chemical vapor deposition. Next, the upper second conductive layer 736 and the upper first conductive layer 737 are formed on the light absorption layer 740. Here, the upper second conductive layer 736 and the upper first conductive layer 737 having opposite polarities are disposed at positions corresponding in the vertical direction to the lower first conductive layer 731 and the lower second conductive layer 732, respectively. The method of forming the upper conductive layers may be the same as the method of forming the lower conductive layers thereunder. Here, a depletion region 735 may be formed between the upper second conductive layer 736 and the upper first conductive layer 737. In the depletion region 735, impurities having the different polarities are injected such that combinations of electron-hole pairs are formed, and the charge carriers are depleted in this region such that this region become a region that is electrically disconnected. When the upper second conductive layer 736 and the upper first conductive layer 737 are formed through the impurity injection using a hard mask, the upper second conductive layer 736 and the upper first conductive layer 737 are formed to be separated from each other such that the intrinsic semiconductor region may be formed between the upper second conductive layer 736 and the upper first conductive layer 737 to thereby obtain the same effects. Also, the depletion region 735 may be eliminated, or may be replaced by an insulating member of an inorganic layer or organic layer.

A rear electrode 750 is formed on the substrate formed with the light absorption layer 740, the upper second conductive layer 736, the upper first conductive layer 737, and the depletion region 735. The material for the rear electrode 750 may be one of Ag, Mo, and Al.

Next, the rear electrode 750, the upper second conductive layer 736, the upper first conductive layer 737, the light absorption layer 740, the lower first conductive layer 731, and the lower second conductive layer 732 are patterned through laser scribing or photolithography such that a first cell 771 and a second cell 772 are connected by the rear electrode 750 thereby forming a pair, and a structure in which pairs of a first cell 771 and a second cell 772 are only connected by the front electrode 720 is formed.

Accordingly, the first cell including the lower first conductive layer, the light absorption layer, and the upper second conductive layer, and the second cell including the lower second conductive layer, the light absorption layer, and the upper first conductive layer are formed with the same layer to neighbor each other such that a cell having the same effect as the vertical deposition structure such as tandem or triplet may be formed by being horizontally deposited. Particularly, the light absorption layer is formed in the contact hole between the lower first conductive layer and the lower second conductive layer, and is connected on the boundary of the first cell and the second cell such that leakage current of the cell side generated by adhesion of an impurity or chemical contamination may be reduced. Also, the light absorption layer formed on the boundary between two neighboring cells functions as a supplying source of the carrier such that the lifetime of the minority carrier of the cell increases, thereby improving the light efficiency.

Figure 15:
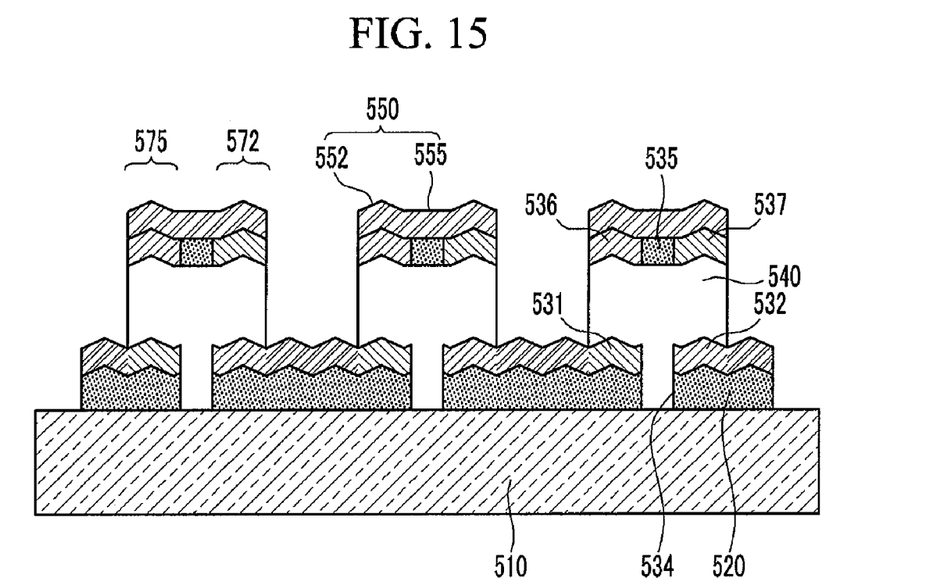
FIG. 15 and FIG. 16 are cross-sectional views for explaining a photovoltaic device for a solar cell according to another embodiment of the present invention.
Figure 16:
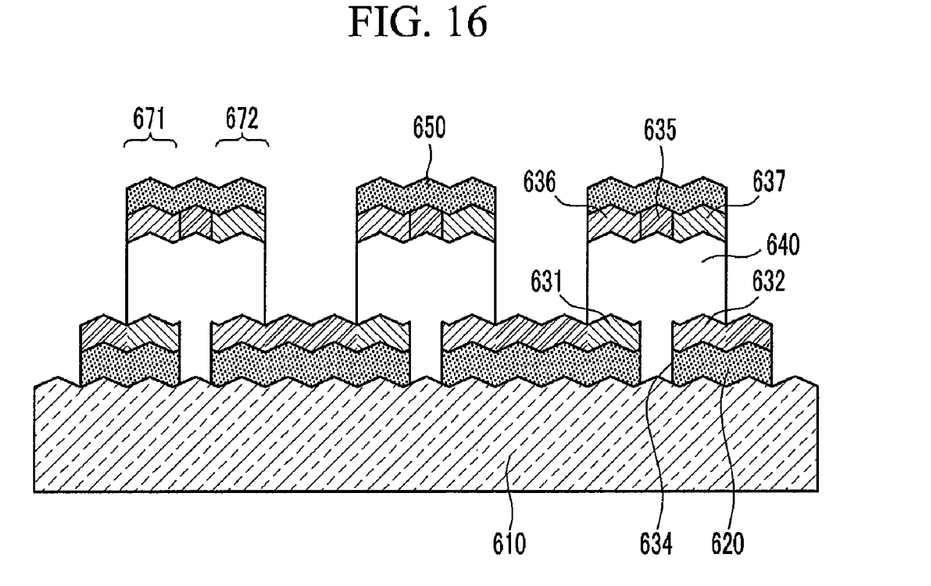

FIG. 15 and FIG. 16 are cross-sectional views for explaining a photovoltaic device for a solar cell according to another embodiment of the present invention.

In an embodiment of FIG. 15, compared with the embodiment of FIG. 10, a depletion region formed between the lower first conductive layer 531 and the lower second conductive layer 532 is not removed, but is maintained, as well as the front electrode 520 between the cells in which the first cell 571 and the second cell 572 are connected to each other by the rear electrode 550. Thus, the portion that will be removed through the laser scribing is decreased such that thermal damage due to the laser irradiation may be reduced.

In an embodiment of FIG. 16, compared with the embodiment of FIG. 11, a depletion region formed between the lower first conductive layer 631 and the lower second conductive layer 632 is not removed, but is maintained, as well as the rear electrode 620 between the cells in which the first cell 671 and the second cell 672 are connected to each other by the front electrode 650. Thus, the portion that will be removed through the laser scribing is decreased such that thermal damage due to the laser irradiation may be reduced.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:
1. A photovoltaic device, comprising:
a substrate;
a first conductive layer on the substrate;
P layers and N layers alternately arranged along a first direction on the first conductive layer, the P layers and the N layers being separated from each other along the first direction by a first interval, and the first interval extending through the first conductive layer; and
I layers covering the P layers and the N layers on the first conductive layer, the I layers being in the first interval between the P layers and the N layers, and the P layers, the I layers, and the N layers along the first direction defining unit cells, each unit cell separated by a second interval that extends between P and N layers of adjacent unit cells.

2. The photovoltaic device of claim 1, wherein the first direction is the same as a direction in which carriers are moved.

3. The photovoltaic device of claim 1, wherein the first interval is in the range of about 0.3 µm to about 2 µm.

4. The photovoltaic device of claim 1, wherein the unit cells are electrically and directly connected to each other through the first conductive layer.

5. The photovoltaic device of claim 4, wherein the unit cells are separated from each other along the first direction by a second interval that is wider than the first interval.

6. The photovoltaic device of claim 5, wherein the unit cells are arranged into a plurality of columns along the first direction, adjacent unit cells within each column being separated from each other along the first direction by the second interval, and unit cells in neighboring columns being separated from each other along a second direction perpendicular to the first direction by a third interval that is wider than the first interval.

7. The photovoltaic device of claim 1, wherein the P layers and the N layers include at least one of amorphous silicon (a-Si), micro-crystalline silicon (mc-Si), and amorphous silicon carbide (a-SiC).

8. The photovoltaic device of claim 1, wherein the I layers include amorphous silicon (a-Si) or amorphous silicon germanium (a-SiGe).

9. The photovoltaic device of claim 1, wherein the first conductive layer includes a transparent conductive layer or a reflective layer.

10. The photovoltaic device of claim 1, further comprising a second conductive layer on the I layers.

11. The photovoltaic device of claim 1, wherein the I layers extend to cover upper surfaces of the P and N layers and to fill the first intervals between respective P and N layers, the first intervals being within the unit cells.

12. The photovoltaic device of claim 11, wherein each of the P and N layers is between the substrate and the I layer, the I layer in the first intervals contacting the substrate, and the first interval separating portions of the conductive layer along the first direction.

13. The photovoltaic device of claim 12, wherein the conductive layer is between the substrate and each of the P and N layers.

14. The photovoltaic device of claim 12, wherein the conductive layer includes a plurality of portions separated from each other, each portion of the conductive layer connecting a P layer of one unit cell to an N layer of an adjacent unit cell.

15. The photovoltaic device of claim 1, wherein each of the P and N layers is between the conductive layer and the I layer, the I layer extending continuously to overlap five surfaces of each of the P and N layers, the I layer contacting the conductive layer in an interval between adjacent unit cells, and the I layer contacting the substrate in an interval between P and N layers within each unit cell.

16. A method for manufacturing a photovoltaic device, the method comprising:
forming a conductive layer on a substrate;
forming alternating P layers and N layers along a first direction on the conductive layer;
patterning the P layers and the N layers to be separated from each other along the first direction by a first interval, the first interval extending through the first conductive layer; and
forming I layers covering and separating the P layers and the N layers on the conductive layer, such that the I layers are in the first interval between the P layers and the N layers, and the P layers, the I layers, and the N layers along the first direction define unit cells, such that each unit cell is separated by a second interval that extends between P and N layers of adjacent unit cells.

17. The method of claim 16, wherein:
the forming of the alternating P layers and the N layers is performed using a mask; and the patterning of the P layers and the N layers is performed using laser scribing, wheel scribing, or chemical etching.

18. The method of claim 16, wherein the patterning of the P layers and the N layers includes selectively etching the conductive layer along with the P layers and the N layers for the P layers and the N layers to be separated by the first interval, the first interval being about 0.3 μm to about 2 μM.

19. The method of claim 18, wherein the patterning of the P layers and the N layers includes forming unit cells separated from each other by a second interval that is wider than the first interval when defining the P layers and the N layers that are separated by the first interval.

* * * * *